(12) United States Patent
Chan et al.

(10) Patent No.: US 8,415,569 B2
(45) Date of Patent: Apr. 9, 2013

(54) FLAT PANEL DISPLAY MODULE HAVING ANTI-SHOCK SCREW-TIGHTENING STRUCTURE

(75) Inventors: Hsun-Tung Chan, Hsin-Chu (TW); Chia-Ying Chao, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 376 days.

(21) Appl. No.: 12/938,536

(22) Filed: Nov. 3, 2010

(65) Prior Publication Data
US 2011/0157844 A1   Jun. 30, 2011

(30) Foreign Application Priority Data
Dec. 30, 2009   (TW) ................................ 98145973 A

(51) Int. Cl.
| | |
|---|---|
| H05K 7/14 | (2006.01) |
| H05K 1/00 | (2006.01) |
| H05K 7/02 | (2006.01) |
| H01R 13/502 | (2006.01) |
| G02F 1/1333 | (2006.01) |
| G02F 1/1345 | (2006.01) |

(52) U.S. Cl.
USPC ........... 174/544; 174/562; 361/749; 361/809; 361/810; 349/58; 349/60; 349/150

(58) Field of Classification Search .......... 174/544–545, 174/562; 349/58, 60, 149, 150; 361/719, 361/749, 789, 807, 809–810
See application file for complete search history.

(56) References Cited

U.S. PATENT DOCUMENTS

| | | | | |
|---|---|---|---|---|
| 4,521,148 A | * | 6/1985 | Tanaka ........................... | 411/182 |
| 5,270,847 A | * | 12/1993 | Sano ............................... | 349/60 |

(Continued)

FOREIGN PATENT DOCUMENTS

| | | |
|---|---|---|
| CN | 101150937 A | 3/2008 |
| CN | 201174843 Y | 12/2008 |

(Continued)

OTHER PUBLICATIONS

English translation of abstract of JP 2000-148028.

(Continued)

*Primary Examiner* — Timothy Thompson
*Assistant Examiner* — Sherman Ng
(74) *Attorney, Agent, or Firm* — McClure, Qualey & Rodack, LLP

(57) ABSTRACT

A flat panel display module having anti-shock screw-tightening structure is provided. The flat panel display module includes a display panel, a flexible printed circuit, a printed circuit board, a back plate, a fastening element, and a flexible separator. The display panel has a signal connecting end. One end of the flexible printed circuit is electrically connected to the signal connecting end while the other end is electrically connected to the printed circuit board. The printed circuit board has a through hole. The back plate accommodates the display panel. The flexible printed circuit is disposed across the back plate so that the printed circuit board is parallel to the back plate. The fastening element which has a length greater than the thickness of the printed circuit board passes through the through hole and is secured to the surface of the back plate. The flexible separator is disposed between the back plate and the printed circuit board and pushes the printed circuit board away from the back plate so that the printed circuit board touches against the fastening element. The flat panel display module maintains a space between the printed circuit board and the back plate to accomplish the purpose of anti-shock.

20 Claims, 8 Drawing Sheets

U.S. PATENT DOCUMENTS

| | | | |
|---|---|---|---|
| 6,633,126 | B1 | 10/2003 | Tsai et al. |
| 6,654,078 | B1 | 11/2003 | Kato et al. |
| 7,046,316 | B2 | 5/2006 | Lai |
| 7,113,237 | B2 * | 9/2006 | Nitto et al. ............. 349/58 |
| 7,192,101 | B2 | 3/2007 | An |
| 7,372,518 | B2 * | 5/2008 | Shiba ................. 349/60 |
| 2002/0064036 | A1 | 5/2002 | Yano et al. |
| 2002/0075425 | A1 * | 6/2002 | Yoshino ............. 349/58 |
| 2007/0236875 | A1 * | 10/2007 | Azuma et al. ............ 361/681 |
| 2008/0158473 | A1 * | 7/2008 | Liang ................. 349/60 |
| 2009/0002594 | A1 * | 1/2009 | Okumura et al. ........... 349/60 |

FOREIGN PATENT DOCUMENTS

| | | |
|---|---|---|
| CN | 101373287 A | 2/2009 |
| CN | 101464572 A | 6/2009 |
| JP | 2000-148028 | 5/2000 |
| JP | 2000-181371 | 6/2000 |
| JP | 2005-352305 | 12/2005 |
| JP | 2008-197165 | 8/2008 |
| JP | 2009-175378 | 8/2009 |
| TW | 469366 | 12/2001 |
| TW | 472944 | 1/2002 |
| TW | 476908 | 2/2002 |
| TW | 500242 | 8/2002 |
| TW | 551795 | 9/2003 |
| TW | 200402577 | 2/2004 |
| TW | 582562 | 4/2004 |
| TW | 200410013 | 6/2004 |
| TW | 200628896 | 8/2006 |
| TW | M309684 | 4/2007 |

OTHER PUBLICATIONS

English translation of abstract of JP 2008-197165.
English translation of abstract of JP 2009-175378.
English translation of abstract of JP 2005-352305.
English translation of abstract of JP 2000-181371.
China Office Action dated Apr. 25, 2011.
China Office Action dated Jun. 24, 2011.
Taiwan Office Action dated Jan. 29, 2013.
English translation of abstract of TW 551795 (published Sep. 1, 2003).
English translation of abstract of TW 200628896 (published Aug. 16, 2006).

* cited by examiner

FLAT PANEL DISPLAY MODULE HAVING ANTI-SHOCK SCREW-TIGHTENING STRUCTURE

BACKGROUND OF THE INVENTION

1. Field of the Invention

The present invention generally relates to a flat panel display module; particularly, the present invention relates to an anti-shock screw-tightening structure of a flat panel display module.

2. Description of the Prior Art

Flat panel display (FPD) products, such as liquid crystal display (LCD), have gradually replaced old type display and extensively applied to a variety of electronic products because of its low power consumption and less space occupation. In order to ensure the durability of electronic products, different structural strength requirements are required for different use of electronic products. For example, the portable notebook must have a certain anti-shock ability. Accordingly, the anti-shock ability of the flat panel display, which is one of the most important components of electronic products, should be considered.

The LCD, as an example of flat display panel, displays images by changing the electric filed to control movements of display particles, wherein the change of electric field is controlled by the circuit disposed on the printed circuit board. FIG. 1A is a perspective view of a conventional flat panel display module. As FIG. 1A shows, the flat display panel 1 and the printed circuit board 2 are generally connected by the flexible printed circuit 3. As FIG. 1B shows, the printed circuit board 2 is fastened to the back plate 5 by the screw 4.

To meet the structural strength requirement, the screw 4 is tightly screwed so that the printed circuit board 2 can be tightly secured to the back plate 5. When the flat panel display module is subjected to shock, the pulling stress between the printed circuit board 2 and the flat display panel 1 will not be effectively dispersed, in a worse circumstance, causing the flexible printed circuit 3 to break.

SUMMARY OF THE INVENTION

It is an object of the present invention to provide a flat panel display module which can avoid over-tight connection between the printed circuit board and the back plate to overcome the problems of the prior art.

It is another object of the present invention to provide a flat panel display module which can improve the ground connection of the printed circuit board to avoid electromagnetic disturbance (EMI) and electrostatic discharge (ESD), et al.

The flat panel display device having anti-shock screw-tightening structure of the present invention includes a display panel, a flexible printed circuit, a printed circuit board, a back plate, a fastening element, and a flexible separator. The display panel has a signal connecting end. One end of the flexible printed circuit is electrically connected to the signal connecting end. The printed circuit board is electrically connected to the other end of the flexible printed circuit and has a through hole. The back plate accommodates the display panel. The flexible printed circuit is disposed across the back plate so that the printed circuit board is parallel to a surface of the back plate. The fastening element includes a cap and a rod, wherein the rod includes a screw portion and a non-screw portion. The non-screw portion is closer to the cap and has a length greater than a thickness of the printed circuit board. The screw portion is inserted into the through hole of the printed circuit board and secured to the surface of the back plate; the non-screw portion is positioned in the through hole with a gap between the non-screw portion and a side wall of the through hole. The flexible separator is disposed between the surface of the back plate and the printed circuit board and configured to push the printed circuit board away from the surface of the back plate to touch against the cap of the fastening element. By design of the fastening element, the flat panel display module on one hand achieves the anti-shock effect by preventing the connection between the printed circuit board and the back plate from being over-tight and on the other hand improves the ground connection of the printed circuit board to avoid EMI and ESD.

DETAILED DESCRIPTION OF THE PREFERRED EMBODIMENT

The present invention provides a flat panel display module having anti-shock screw-tightening structure. In a preferred embodiment, the flat panel display module uses a liquid crystal display panel. However, in other embodiments, the flat panel display module uses flat display panel of other types, such as plasma display panel.

Figure 1A:
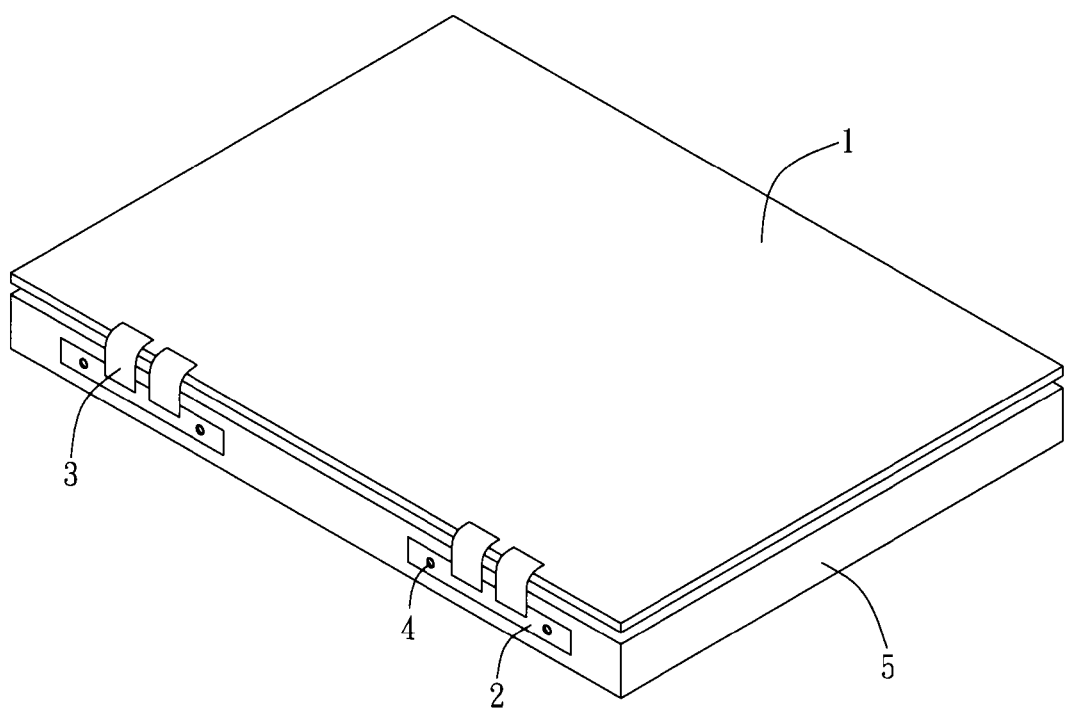
FIG. 1A is a perspective view of a conventional flat panel display module.
Figure 1B:
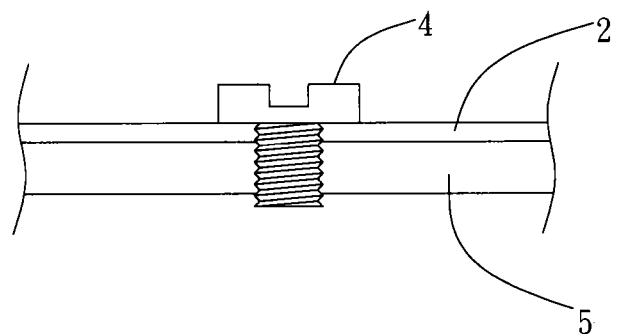
FIG. 1B is a partial cross-sectional view of the flat panel display module shown in FIG. 1A.
Figure 2A:
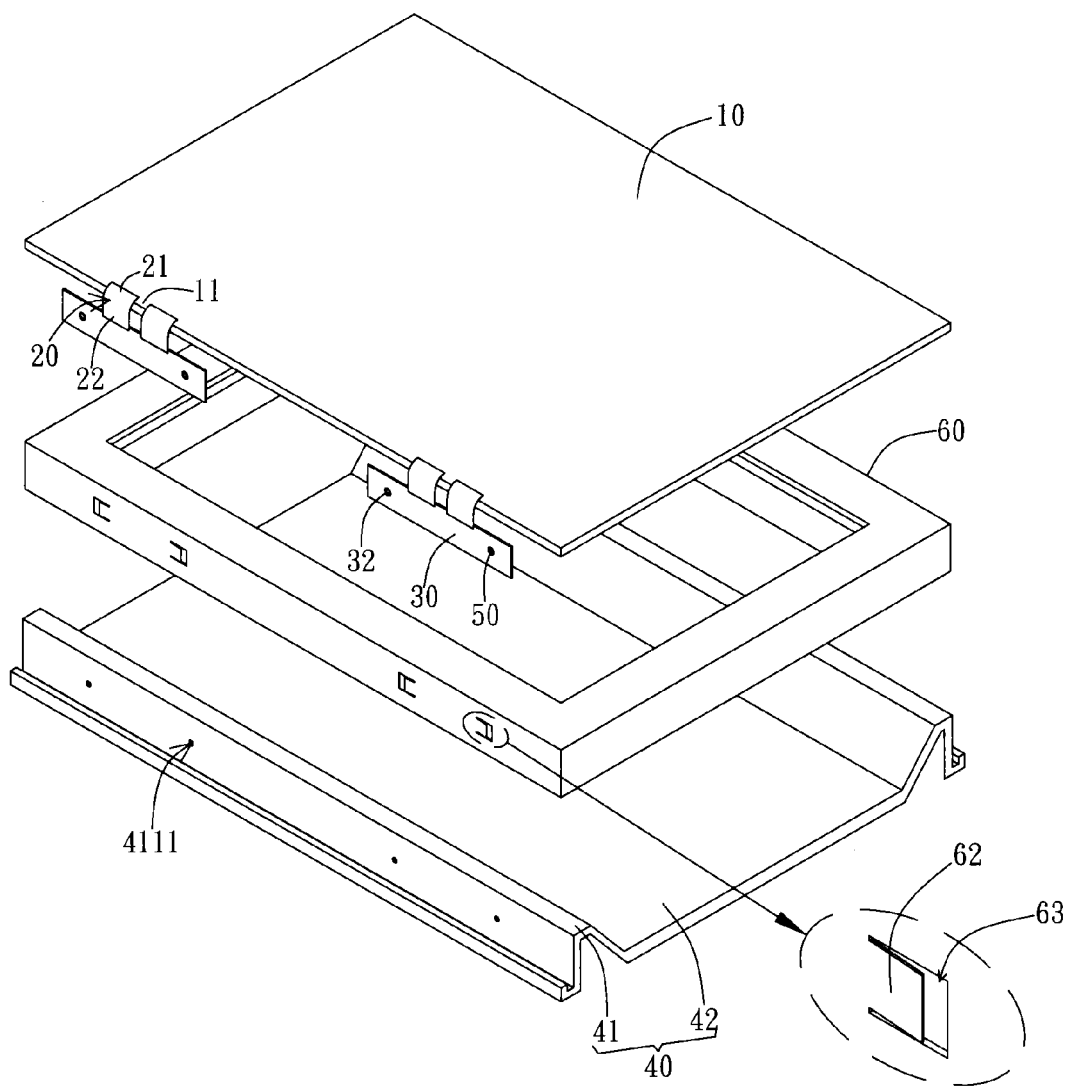
FIG. 2A is an exploded view of the embodiment of the flat panel display module having anti-shock screw-tightening structure of the present invention.

FIG. 2A is an exploded view of the flat panel display module having anti-shock screw-tightening structure of the present invention. As FIG. 2A shows the flat panel display module includes a display panel 10, a flexible printed circuit 20, a printed circuit board 30, a back plate 40, a fastening element 50, an insulation structure 60, and a flexible separator; in the preferred embodiment, the flexible separator is a resilient part 62 (see FIG. 2C). The display panel 10 is disposed on the back plate 40 and has a signal connecting end 11. One end 21 of the flexible printed circuit 20 is electrically connected to the signal connection end 11 while the other end 22 is electrically connected to the printed circuit board 30, so that an electrical connection between the display panel 10 and the printed circuit board 30 is achieved.

Figure 2B:
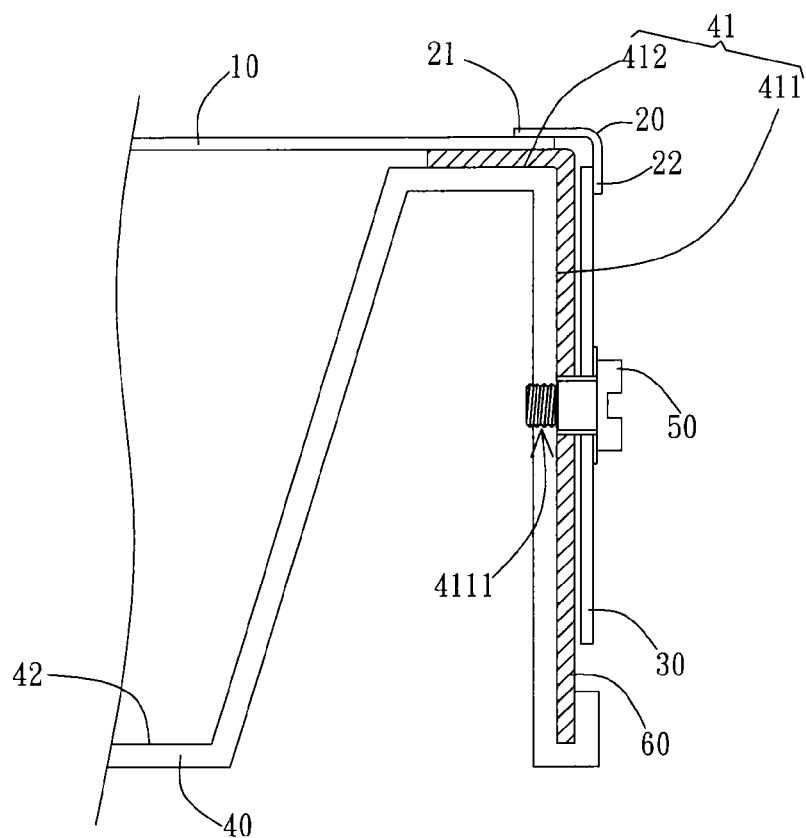
FIG. 2B is a partial cross-sectional view of the flat panel display module shown in FIG. 2A.

FIG. 2B is a partial cross-sectional view of the flat panel display module shown in FIG. 2A. As shown in FIG. 2B, the back plate 40 includes a side structure 41 and a bottom 42 connected to the side structure 41. The side structure 41 extends upward from an edge of the back plate 40 and bends to form a structure with a cross-section of inverted U shape or inverted V shape. The middle section of the back plate 40 forms the flat bottom 42. The side structure 41 includes a surface 411 and an end surface 412, wherein the surface 411 is an outer surface of the side structure 41, and the end surface 412 is adjacent and/or perpendicular to the surface 411. A screw hole 4111 is formed on the surface 411 for engaging with the fastening element 50. The flexible printed circuit 20 is disposed over a corner of the side structure 41 with one end 21 connected to the display panel 10 and bent across the end surface 412 to extend in a direction toward the surface 411 so that the printed circuit board 30 connected to the other end 22 of the flexible printed circuit 20 is parallel to the surface 411. In the present embodiment, the back plate 40 accommodates the display panel 10 in a way of supporting from underside so that the display panel 10 is parallel to the bottom 42.

Figure 2C:
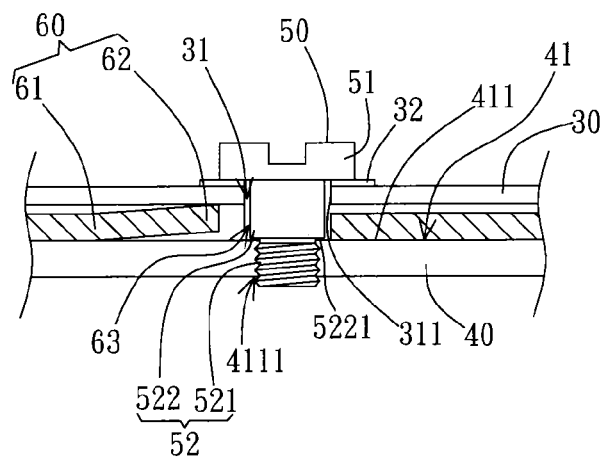
FIG. 2C is another partial cross-sectional view of the flat panel display module shown in FIG. 2A.
Figure 2D:
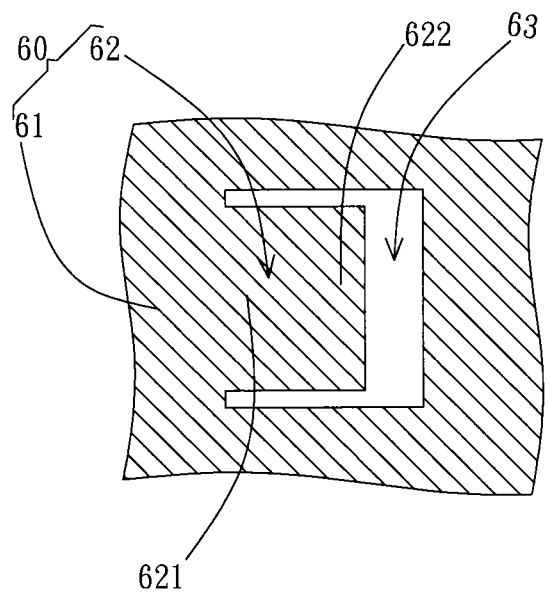
FIG. 2D is a schematic view of the resilient part of the flat panel display module shown in FIG. 2A.

An insulation structure 60 is disposed between the printed circuit board 30 and the back plate 40 and between the display panel 10 and the back plate 40. The fastening element 50 passes through the insulation structure 60 to be secured to the back plate 40. In the present embodiment, the insulation structure 60 is a plastic frame surrounding the outer surface 411 of the side structure 41 of the back plate 40; however, in other embodiments, the insulation structure 60 can be a sheet or a pad made of plastic or other insulating materials. FIG. 2C is another partial cross-sectional view of the flat display module shown in FIG. 2A. As FIG. 2C shows, the insulation structure 60 includes a body 61 and a resilient part 62, wherein the resilient part 62 is connected to the body 61. The printed circuit board 30 has a through hole 31, wherein the insulation structure 60 has a through hole 63 disposed corresponding to the through hole 31. FIG. 2D is a schematic view of the resilient part of the flat display panel shown in FIG. 2A. As FIG. 2D shows, the resilient part 62 is formed on one side of the through hole 63 by cutting a portion of the insulation structure 60. A connecting end 621 of the resilient part 62 is connected to the body 61, and the opposite end is separated from the body 61 as a free end 622. The free end 622 separated from the body 61 bends and extends toward the printed circuit board 30 so that the printed circuit board 30 disposed over the insulation structure 60 contacts the free end 622 of the resilient part 62. Besides, the free end 622 preferably faces toward and gets close to the fastening element 50 to concentrate the pushing force of the free end 622.

Figure 3A:
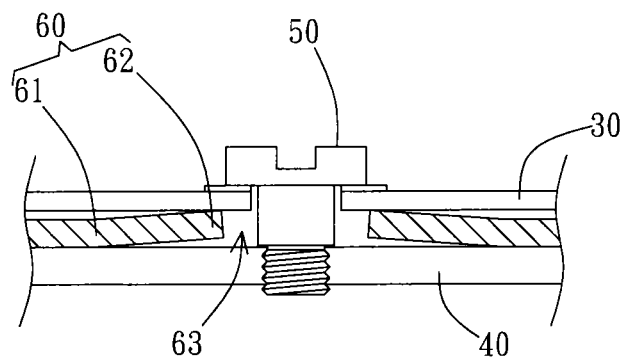
FIG. 3A is a cross-sectional view of another embodiment of the resilient part of the flat panel display module having anti-shock screw-tightening structure of the present invention.
Figure 3B:
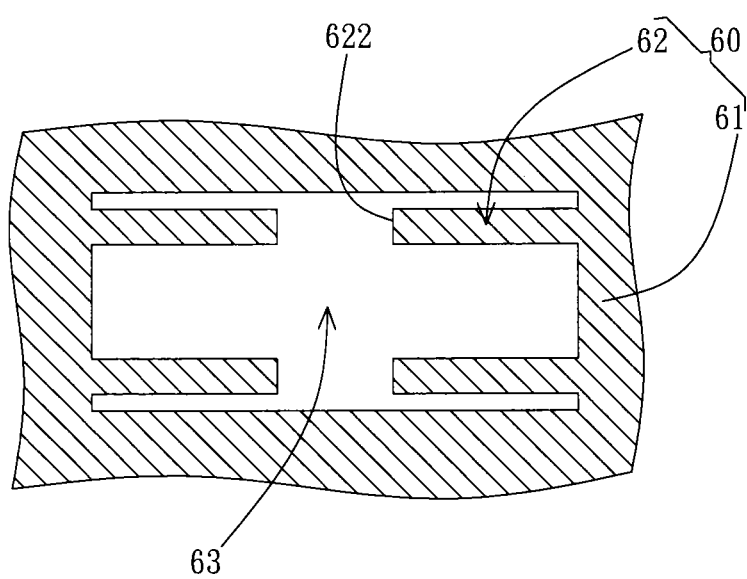
FIG. 3B is a schematic view of the resilient part of the flat panel display module shown in FIG. 3A.

However, in other embodiments, the resilient part 62 can be formed in other forms. FIG. 3A is a cross-sectional view of another embodiment of the resilient part of the flat panel display module having anti-shock screw-tightening structure of the present invention; FIG. 3B is a schematic view of the resilient part of the flat panel display module shown in FIG. 3A. As FIG. 3A and FIG. 3B show, a plurality of resilient parts 62 can be formed around the through hole 63 and extend respectively toward the printed circuit board 30, wherein the resilient parts 62 are disposed in pair(s) and arranged in parallel. In this embodiment, the free ends 622 of the resilient parts 62 are evenly distributed around the through hole 63 to provide a stable uniform force to push the printed circuit board 30.

Figure 4:
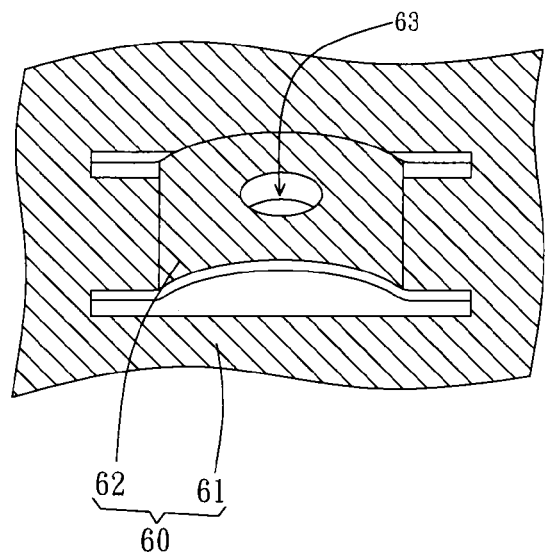
FIG. 4 is a schematic view of another embodiment of the resilient part of the flat panel display module having anti-shock screw-tightening structure of the present invention.

FIG. 4 is a schematic view of another embodiment of the resilient part of the flat panel display module having anti-shock screw-tightening structure. As FIG. 4 shows, two ends of the resilient part 62 are connected to the body 61, and a middle portion of the resilient part 62 bulges and extends toward the printed circuit board 30 (not shown). In other words, the resilient part 62 has no free end. In this embodiment, the through hole 63 is formed in the middle portion of the resilient part 62 for allowing the fastening element 50 to pass therethrough to be secured to the side structure 41. Besides, the resilient part 62 of the present embodiment is preferably formed by in-mold injection.

The printed circuit board 30 contains an exposed copper area 32 around the through hole 31. In this embodiment, the resilient part 62 provides a resilient force for supporting the printed circuit board 30 and further functions as an insulator between the printed circuit board 30 and the back plate 40. The resilient part 62 disposed between the surface 411 of the back plate 40 and the printed circuit board 30 pushes the printed circuit board 30 away from the surface 411 while supporting the printed circuit board 30 and enables the exposed copper area 32 to contact or touch against a cap 51 of the fastening element 50, making the printed circuit board 30 electrically connect to the back plate 40. The back plate 40 is a large piece of metal plate and can serve as a good ground element. Therefore, by such a fastening element 50, the flat panel display module of the present invention improves the ground connection of the printed circuit board 30 so that EMI and ESD can be avoided.

In the present embodiment, as FIG. 2C shows, the fastening element 50 is preferably a shoulder screw which includes the cap 51 and a rod 52. The cap 51 is disposed on the printed circuit board 30. The rod 52 includes a screw portion 521 and a non-screw portion 522, wherein the non-screw portion 522 is closer and connected to the cap 51. In a preferred embodiment, the screw portion 521 is a threaded portion, namely a portion formed with threads for engaging with the screw hole 4111 of the back plate 40, and the non-screw portion 522 serves as a shoulder, namely a threadless portion protruding outside the screw portion 521 and having a smooth surface.

In the present embodiment, as FIG. 2C shows, a radius of the non-screw portion 522 is preferably slightly greater than that of the screw portion 521 to form the shoulder with a contacting face 5221 on one side. When the fastening element 50 is secured to the back plate 40, the contacting face 5221 contacts the surface 411 of the side structure 41 so that the fastening element 50 is prevented from being over-tightly secured to the back plate 40. The screw portion 521 passes through the through hole 31 of the printed circuit board 30 and the through hole 63 of the insulation structure 60 to be secured to the surface of the back plate 40. The non-screw portion 522 is positioned in the through hole 31 and the through hole 63 with a gap between the non-screw portion 522 and side walls of the through hole 31 and through hole 63 to provide a space for absorb the relative displacement of the printed circuit board 30 and the fastening element 50.

Figure 5:
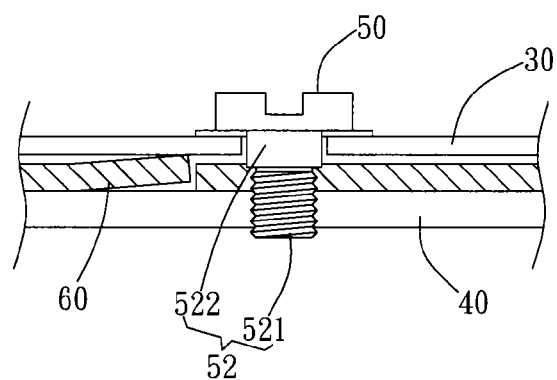
FIG. 5 is a cross-sectional view of another embodiment of the resilient part of the flat panel display module having anti-shock screw-tightening structure of the present invention.

In the embodiment, as FIG. 2C shows, a length of the non-screw portion 522 is greater than a thickness of the printed circuit board 30 and greater than the total thickness of the printed circuit board 30 and the insulation structure 60 (preferably with a difference of 0.5 mm), therefore the fastening element 50 will not be secured to the insulation structure 60. FIG. 5 is a schematic view of another embodiment of the flat panel display module having anti-shock screw-tightening structure of the present invention. As FIG. 5 shows, the length of the non-screw portion 522 is greater than a thickness of the printed circuit board 30 but smaller than the total thickness of the printed circuit board 30 and the insulation structure 60. In such a case, the screw portion 521 is simultaneously secured to the printed circuit board 30 and the insulation structure 60. Such a design helps to fix the insulation structure 60 in a corresponding position and achieve a tighter fastening effect.

By means of the fastening element 50 and the resilient part 62, on one hand, the display module of the present invention can achieve a mutual fastening effect of the printed circuit board 30 and the back plate 40; on the other hand, the space between the printed circuit board 30 and the back plate 40 can absorb the relative displacement of the printed circuit board 30 and the back plate 40 caused by vibration and reduce the damage induced therefrom.

Figure 6A:
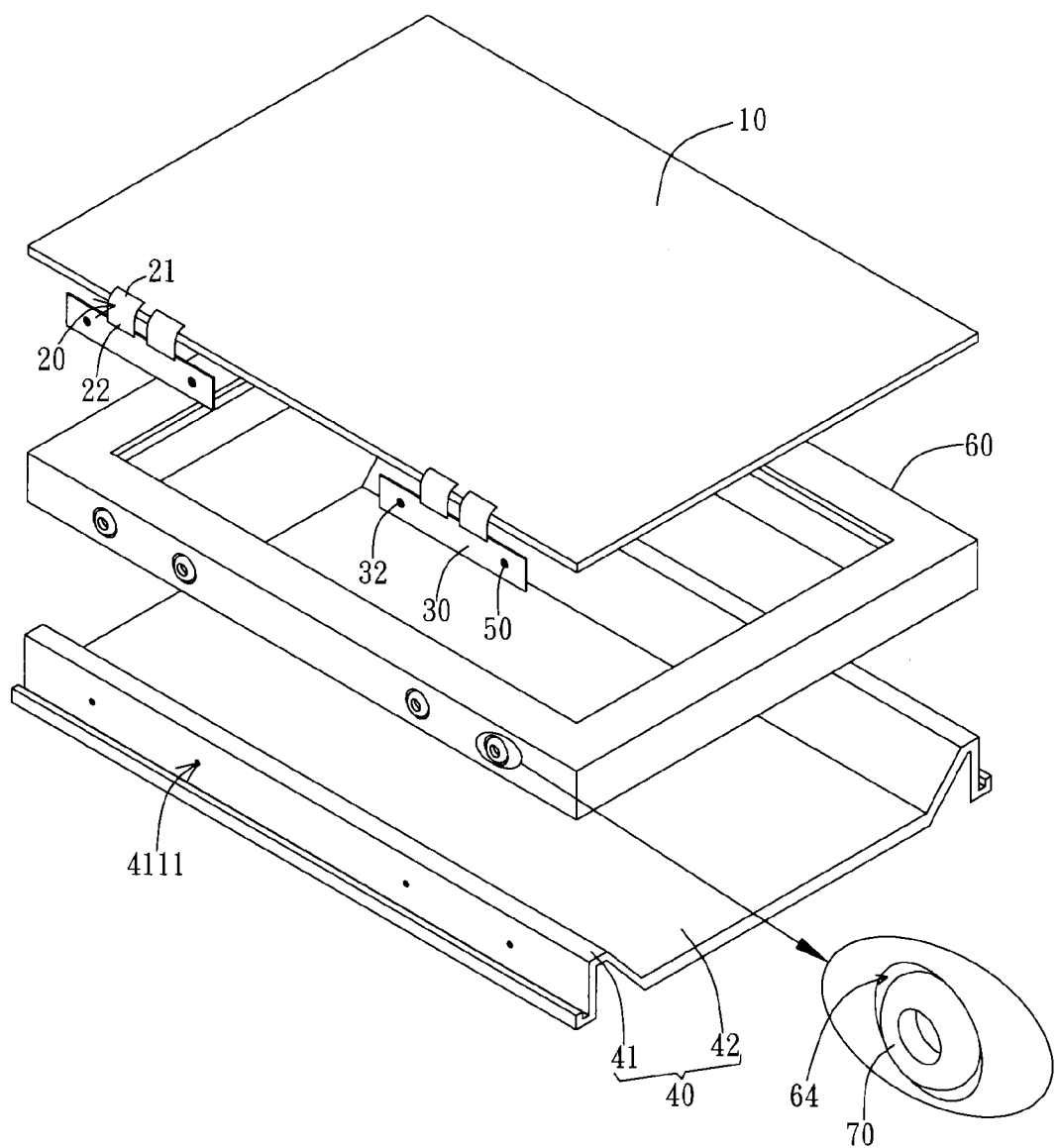
FIG. 6A is a schematic view of another embodiment of the flat panel display module having anti-shock screw-tightening structure of the present invention.
Figure 6B:
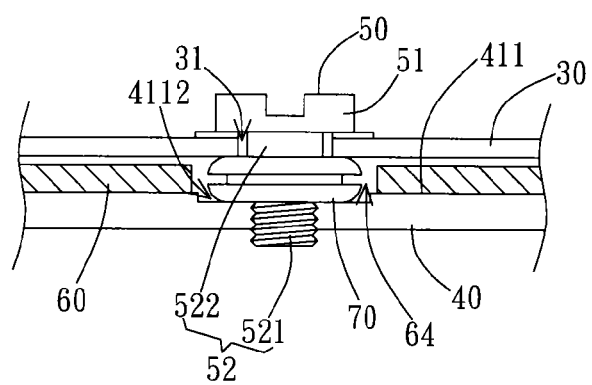
FIG. 6B is a partial cross-sectional view of the flat panel display module shown in FIG. 6B.

In other embodiments, the flexible separator can be carried out by other means. As FIGS. 6A and 6B show, the flexible separator is an annular rubber washer 70. The insulation structure 60 has a containing hole 64 corresponding to the through hole 31, wherein the annular rubber washer 70 is accommodated in the containing hole 64. The annular rubber washer 70 surrounds a lower part of the non-screw portion 522 and touches against an annular area around the through hole 31 of the printed circuit board 30 with its top end. In the embodiment shown in FIGS. 6A and 6B, the back plate 40 has a trough 4112 on the surface 411. The bottom of the annular rubber washer 70 is accommodated in the trough 4112 and contacts the bottom of the trough 4112; however, in other embodiments, the trough 4112 can be omitted and the bottom of the annular rubber washer 70 directly contacts the flat surface 411. Besides, in other embodiments, the rubber washer can be replaced by other elements, such as a spring.

Although the preferred embodiments of present invention have been described herein, the above description is merely illustrative. The preferred embodiments disclosed will not limited the scope of the present invention. Further modification of the invention herein disclosed will occur to those skilled in the respective arts and all such modifications are deemed to be within the scope of the invention as defined by the appended claims.

What is claimed is:

1. A display module, comprising:
  a display panel having a signal connecting end;
  a flexible printed circuit, one end of the flexible printed circuit electrically connected to the signal connecting end;
  a printed circuit board electrically connected to the other end of the flexible printed circuit, wherein the printed circuit board has a through hole;
  a back plate for accommodating the display panel, wherein the flexible printed circuit is disposed across the back plate so that the printed circuit board is parallel to a surface of the back plate;
  a fastening element including a cap and a rod, the rod having a screw portion and a non-screw portion connected to the cap, the fastening element having a length greater than a thickness of the printed circuit board, wherein the screw portion is inserted into the through hole of the printed circuit board and secured to the surface of the back plate, the non-screw portion is positioned in the through hole with a gap between the non-screw portion and a side wall of the through hole; and
  a flexible separator disposed between the surface of the back plate and the printed circuit board, the flexible separator pushing the printed circuit board away from the surface of the back plate to touch against the cap of the fastening element.

2. The display module of claim 1, wherein the back plate includes a side structure, the surface is an outer surface of the side structure, the flexible printed circuit is bent across an end surface of the side structure adjacent to the outer surface so that the printed circuit board is parallel to the outer surface.

3. The display module of claim 1, further comprising an insulation structure disposed between the back plate and the printed circuit board, the fastening element passing through the insulation structure to be secured to the back plate.

4. The display module of claim 3, wherein the length of the non-screw portion is greater than a total thickness of the printed circuit board and the insulation structure.

5. The display module of claim 3, wherein the length of the non-screw portion is smaller than a total thickness of the printed circuit board and the insulation structure, and the screw portion is secured to the insulation structure simultaneously.

6. The display module of claim 3, wherein the insulation structure is a plastic frame surrounding the back plate.

7. The display module of claim 3, wherein the insulation structure includes a body and a resilient part connected to the body, the flexible separator is the resilient part, the resilient part pushes the printed circuit board away from the body.

8. The display module of claim 7, wherein one end of the resilient part is connected to the insulation structure, the other end is a free end away from the body and extends toward the printed circuit board.

9. The display module of claim 8, wherein the free end extends toward the fastening element.

10. The display module of claim 7, wherein two ends of the resilient part are connected to the body, a middle portion of the resilient part extends toward the printed circuit board.

11. The display module of claim 1, wherein the printed circuit board contains an exposed copper area around the through hole, the flexible separator pushes the printed circuit board so that the exposed copper area contacts the cap.

12. The display module of claim 1, wherein the flexible separator is an annular rubber washer surrounding the fastening element and touching against an annular area of the printed circuit board around the through hole.

13. The display module of claim 3, wherein the insulation structure has a containing hole corresponding to the through hole, the flexible separator is accommodated in the containing hole.

14. The display module of claim 12, wherein a bottom of the annular rubber washer directly contacts the surface of the back plate.

15. The display module of claim 12, wherein the back plate has a trough on the surface, a part of the annular rubber washer is accommodated in the trough and contacts a bottom of the trough.

16. The display module of claim 1, wherein the screw portion is a threaded portion, the non-screw portion is a threadless portion.

17. A display module, comprising:
  a back plate including a bottom and a plurality of side structures connected to the bottom;
  a display panel disposed on the back plate and parallel to the bottom;
  a plastic frame surrounding the side structures and having a body and a resilient part, the body having a containing hole, wherein the resilient part is disposed corresponding to the containing hole and includes a connecting end connected to the body and a free end opposite to the connecting end;
  a printed circuit board disposed over the plastic frame to contact the free end and parallel to one of the side structures of the back plate, the printed circuit board having a through hole corresponding to the containing hole, wherein the side structure has a screw hole;

a flexible printed circuit electrically connected to the display panel and the printed circuit board;

a shoulder screw comprising a cap, a shoulder, and a screw portion, wherein the shoulder is connected to the cap and the screw portion, the screw portion is secured to the screw hole of the side structure, the shoulder is inserted into the containing hole of the plastic frame and the through hole of the printed circuit board, the cap is disposed on the printed circuit board.

18. The display module of claim 17, wherein the resilient part extends from the body toward the printed circuit board.

19. The display module of claim 17, wherein the free end extends toward the shoulder screw.

20. The display module of claim 17, wherein the printed circuit board has an exposed copper area around the through hole, the resilient part pushes the printed circuit board so that the exposed copper area contacts the cap.

* * * * *